US009384813B2

(12) United States Patent
Aoki et al.

(10) Patent No.: US 9,384,813 B2
(45) Date of Patent: Jul. 5, 2016

(54) SEMICONDUCTOR DEVICE APPLICABLE TO A MULTI-CONTEXT PROGRAMMABLE LOGIC DEVICE

(71) Applicant: Semiconductor Energy Laboratory Co., Ltd., Atsugi-shi, Kanagawa-ken (JP)

(72) Inventors: Takeshi Aoki, Kanagawa (JP); Munehiro Kozuma, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/613,554

(22) Filed: Feb. 4, 2015

(65) Prior Publication Data

US 2015/0228324 A1    Aug. 13, 2015

(30) Foreign Application Priority Data

Feb. 7, 2014  (JP) ................... 2014-022576

(51) Int. Cl.
| | | |
|---|---|---|
| *G11C 11/34* | (2006.01) | |
| *G06F 17/50* | (2006.01) | |
| *H03K 19/177* | (2006.01) | |

(52) U.S. Cl.
CPC ............ *G11C 11/34* (2013.01); *G06F 17/5045* (2013.01); *G06F 17/5054* (2013.01); *H03K 19/177* (2013.01)

(58) Field of Classification Search
CPC .......... G11C 7/12; G11C 16/10; G11C 16/12; G11C 11/34
See application file for complete search history.

(56) References Cited

U.S. PATENT DOCUMENTS

| | | | |
|---|---|---|---|
| 6,683,477 B1* | 1/2004 | Lall ...................... | H03K 19/177 326/121 |
| 7,028,240 B1* | 4/2006 | Bautista, Jr. ........... | G11C 29/16 365/185.29 |
| 7,330,050 B2* | 2/2008 | Redgrave ........... | H03K 19/1776 326/37 |
| 7,804,730 B2* | 9/2010 | Redgrave ................. | G11C 7/06 365/154 |
| 8,517,753 B2 | 8/2013 | Kataoka et al. | |
| 8,547,753 B2 | 10/2013 | Takemura et al. | |
| 8,675,382 B2 | 3/2014 | Kurokawa | |
| 8,970,251 B2 | 3/2015 | Kurokawa | |
| 2002/0176273 A1* | 11/2002 | Kang ..................... | G11C 11/22 365/145 |
| 2014/0225641 A1 | 8/2014 | Kozuma et al. | |
| 2015/0061742 A1 | 3/2015 | Maehashi et al. | |
| 2015/0145559 A1 | 5/2015 | Kozuma et al. | |
| 2015/0188520 A1 | 7/2015 | Aoki et al. | |
| 2015/0213846 A1* | 7/2015 | Nakagawa ............... | G11C 5/06 365/72 |

FOREIGN PATENT DOCUMENTS

| | | |
|---|---|---|
| JP | 2011-172214 | 9/2011 |
| JP | 2012-186797 | 9/2012 |

* cited by examiner

*Primary Examiner* — Tuan T Nguyen
(74) *Attorney, Agent, or Firm* — Fish & Richardson P.C.

(57) ABSTRACT

A low-power semiconductor device is provided. A memory device applicable to a multi-context programmable logic device (PLD) includes at least memory cells the number of which is the same as the number of contexts. Output nodes of the memory cells are electrically connected to an output node of a configuration memory through different path transistors. A circuit including a transistor and a capacitor makes a gate potential of the path transistor higher than a high-level potential. This prevents a decrease in the potential of the output node of the configuration memory due to the threshold voltage of the path transistor without an increase in power consumption.

18 Claims, 13 Drawing Sheets

30

US 9,384,813 B2

SEMICONDUCTOR DEVICE APPLICABLE TO A MULTI-CONTEXT PROGRAMMABLE LOGIC DEVICE

BACKGROUND OF THE INVENTION

1. Field of the Invention

One embodiment of the present invention relates to a semiconductor device, a method for driving the semiconductor device, a method for manufacturing the semiconductor device, and the like.

Note that the present invention is not limited to the above technical field. The technical field of one embodiment of the invention disclosed in the specification, the drawings, and the claims (hereinafter referred to as "this specification and the like") relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

A programmable logic device (PLD) that can be programmed by a user after shipment so that its circuit function can be changed once or more than once is known as a kind of semiconductor integrated circuit. The PLD is referred to as a configurable circuit or a configurable device in some cases. A PLD circuit whose circuit function can be changed more than once is particularly referred to as a reconfigurable circuit in some cases.

Examples of the PLD are small-scale logics such as a programmable array logic (PAL) and a generic array logic (GAL) and large-scale logics such as a complex programmable logic device (CPLD) and a field programmable gate array (FPGA).

The PLD includes programmable logic elements (PLE) and programmable switch elements (PSE). The function of each PLE or connection between PLEs with PSEs is programmed by a user after manufacture so that the circuit structure and function of the PLD can be changed. Data for setting the PLE function and the connection between the PLEs is referred to as configuration data, and a storage circuit for storing the data is referred to as a configuration memory. Writing data for setting that is stored in a configuration memory is referred to as configuration.

A dynamic reconfiguration technology in which the circuit structure of a PLD is changed while a system including the PLD is operated is known. A multi-context method is known as a dynamic reconfiguration method. The multi-context method is a method for changing the circuit structure of a PLD by storing a plurality of sets of configuration data corresponding to a plurality of circuit structures and by switching the sets of configuration data to be used.

With the downsizing of a PLD, an increase in power consumption becomes a problem. To solve the problem, for example, as disclosed in Patent Document 1, supply of power to unused or non-active circuit blocks is stopped by using a power gating switch. For example, as disclosed in Patent Document 1, supply of power to blocks that are independent of a circuit structure is stopped in accordance with the change in the circuit structure by a programming cell including an oxide semiconductor. Furthermore, for example, as disclosed in Patent Document 2, the use of a transistor including an oxide semiconductor film in a memory cell storing configuration data eliminates refresh operation.

REFERENCE

Patent Document 1: Japanese Published Patent Application No. 2011-172214
Patent Document 2: Japanese Published Patent Application No. 2012-186797

SUMMARY OF THE INVENTION

In a multi-context PLD (hereinafter referred to as "MC-PLD" in some cases), a configuration memory can store a plurality of contexts. Specifically, the configuration memory includes memory cells the number of which is the same as the number of contexts, and reads configuration data corresponding to a context to be used from the memory cell in accordance with a context selection signal. Here, a multi-context configuration memory is referred to as "MC-CFGM" in some cases. FIG. 9 is an example of an MC-CFGM in which the number of contexts is two.

As illustrated in FIG. 9, an MC-CFGM 1 includes two memory cells (MemC) 1, transistors M1 and M2, and a circuit 3. Hereinafter, two contexts are distinguished from each other by identification numbers "0" and "1." Similarly, signals, wirings, or the like are distinguished from each other by identification numbers "0" and "1." When components denoted by symbols are distinguished from each other by identification numbers "0" and "1," the symbols are omitted in some cases.

A node N0 is an output node of the MC-CFGM 1. A node N1 is an output node of MemC[0], and a node N2 is an output node of MemC[1]. The on or off state of the transistor M1 is controlled by a signal Context[0], and the on or off state of the transistor M2 is controlled by a signal Context[1]. The transistors M1 and M2 can function as path transistors. The transistor M1 can control conduction between the nodes N1 and N0, and the transistor M2 can control conduction between the nodes N2 and N0. The potential level of the node N0 is based on configuration data corresponding to a context to be used.

In the case where high (H) level data is output from MemC[0] or MemC[1] in the MC-CFGM 1 where the transistors M1 and M2 are n-channel transistors, the potential of the node N0 is not increased to the same potential as the potential of the node N1 or N2 but is decreased by the threshold voltages of the transistors M1 and M2. The decrease in the potential of the node N0 might cause malfunction of a PLD including the MC-CFGM 1. If the drive voltage of the PLD is low, this problem becomes apparent. Thus, to output an H-level potential from the node N0 more reliably, for example, the circuit 3 illustrated in FIG. 9 is provided in the output node N0. The circuit 3 is referred to as a keeper circuit in some cases. In FIG. 9, the circuit 3 includes a transistor Mp3 and an inverter INV3. VH1 is a high power supply potential.

Assuming that the node N1 is at an H level, the transistor M1 is on, and the transistor M2 is off, the node N0 is set at an H level in the circuit 3; thus, an output of the inverter INV3 is set at a low (L) level and the transistor Mp3 is turned on. Accordingly, the high power supply potential VH1 can be supplied to the node N0. In other words, the potential VH1 can be supplied to the node N0 without influence from the threshold voltage of the transistor M1.

In the case where the transistors M1 and M2 are p-channel transistors, to prevent the increase in the potential of the node N0 due to the threshold voltages of the transistors M1 and M2, the transistor Mp3 may be an n-channel transistor and a low power supply potential may be supplied instead of VH1 in the circuit 3.

The use of the circuit 3 can set the potential of the node N0 to a potential that is not influenced by the threshold voltages of the transistors M1 and M2. However, in the circuit 3, power is consumed by supply of VH1 and supply of a power supply potential to the inverter INV3. In particular, in the case where the PLD is driven at low voltage, the power consumption of the circuit 3 becomes a problem.

An object of one embodiment of the present invention is to provide a novel semiconductor device, a novel method for driving the semiconductor device, a novel method for manufacturing the semiconductor device, or the like. For example, an object of one embodiment of the present invention is to provide a novel semiconductor device that can function as a configuration memory. For example, an object of one embodiment of the present invention is to provide a low-power semiconductor device or a method for driving the semiconductor device. For example, an object of one embodiment of the present invention is to provide a semiconductor device where malfunction can be inhibited or a method for driving the semiconductor device.

Note that other objects will be apparent from the description of the specification, the drawings, the claims, and the like, and other objects of embodiments of the present invention can be derived from the description of the specification, the drawings, the claims, and the like. One embodiment of the present invention does not necessarily achieve all the objects.

One embodiment of the present invention is a semiconductor device that includes a first output node and k first circuits (k is an integer of two or more). The first circuit includes a first memory circuit including a second output node, a first transistor, a second transistor, and a capacitor. K first signals are input to the different k first circuits, and each of the k first signals is input to any one of the k first circuits. One of terminals of the capacitor is electrically connected to the first output node. The other of the terminals of the capacitor is electrically connected to the second output node. The first transistor is capable of controlling conduction between the first output node and the second output node. The second transistor is capable of controlling supply of the first signal to a gate of the first transistor. In the k first circuits, the on or off state of the second transistor may be controlled by a common second signal.

Note that in this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a display device, a light-emitting device, a lighting device, an electronic device, and the like include a semiconductor device in some cases.

One embodiment of the present invention can provide a novel semiconductor device, a novel method for driving the semiconductor device, a novel method for manufacturing the semiconductor device, or the like. For example, one embodiment of the present invention can provide a novel semiconductor device that can function as a configuration memory. For example, one embodiment of the present invention can provide a low-power semiconductor device or a method for driving the semiconductor device. For example, one embodiment of the present invention can provide a semiconductor device where malfunction can be inhibited or a method for driving the semiconductor device.

Note that the description of these effects does not disturb the existence of other effects. In one embodiment of the present invention, there is no need to obtain all the effects described above. In one embodiment of the present invention, other objects, effects, and novel features will be apparent from and can be derived from the description of the specification and the drawings.

DETAILED DESCRIPTION OF THE INVENTION

Figure 1:
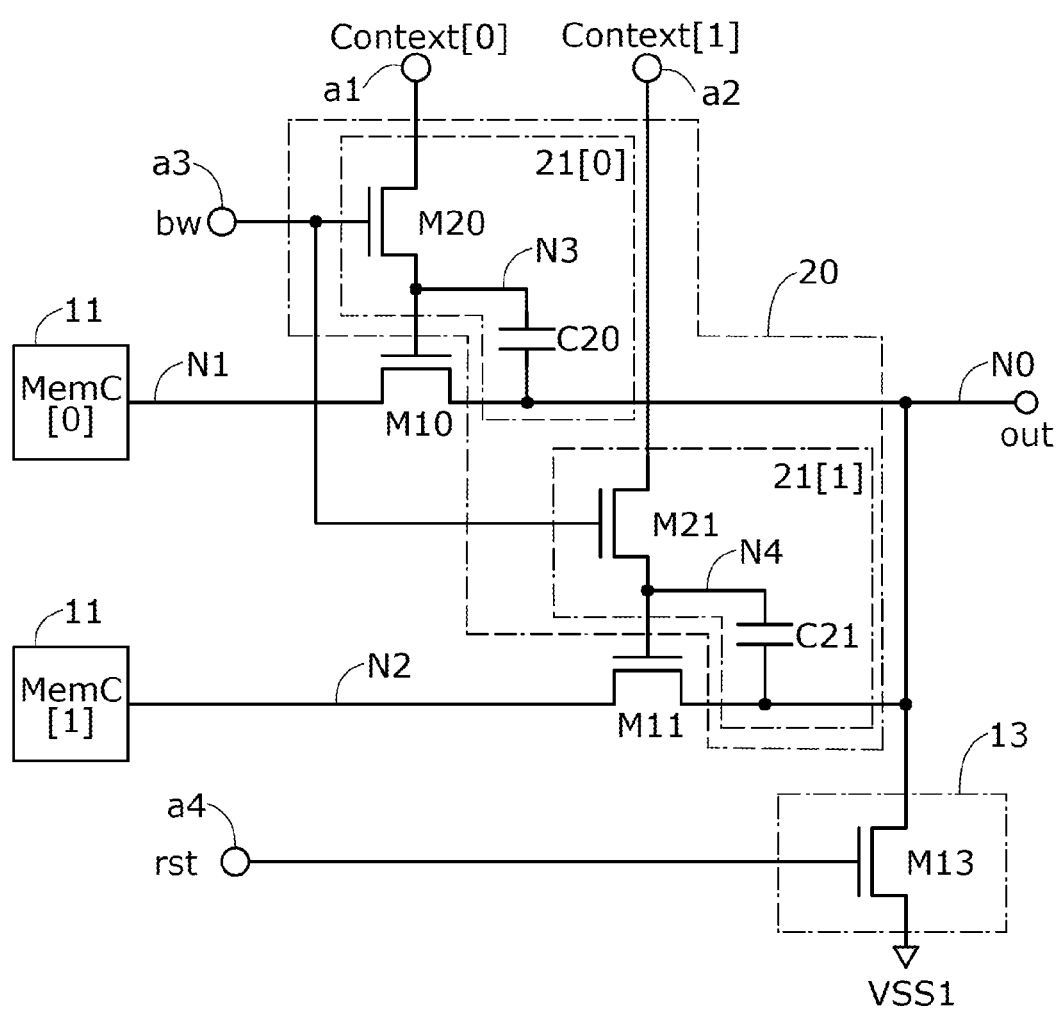
FIG. 1 is a circuit diagram illustrating a structure example of a multi-context configuration memory.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, or a layer). Accordingly, a connection relationship other than those shown in drawings and texts is also included without limitation to a predetermined connection relationship, for example, the connection relationship shown in the drawings and the texts.

Note that the term "electrical connection" means a circuit structure in which current, voltage, or a potential can be supplied or transmitted. Accordingly, the expression "two components are connected" means not only a circuit structure in which the two components are directly connected but also a circuit structure in which the two components are electrically connected through an element such as a wiring, a resistor, a diode, or a transistor so that current, voltage, or a potential can be supplied or transmitted.

Even when independent components are connected in a circuit diagram, there is the case where one conductive film has functions of a plurality of components, such as the case where part of a wiring functions as an electrode. The term "connection" in this specification also means such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that voltage refers to a difference between potentials of two points, and a potential refers to electrostatic energy (electric potential energy) of a unit electric charge at a given point in an electrostatic field. In general, a difference between a potential of one point and a reference potential (e.g., a ground potential) is merely called a potential or voltage, and a potential and voltage are used as synonyms in many cases. Thus, in this specification, a potential may be rephrased as voltage and voltage may be rephrased as a potential unless otherwise specified.

Note that a transistor is an element having three terminals: a gate, a source, and a drain. Depending on the channel type of the transistor or levels of potentials applied to the terminals, one of two terminals (source and drain) functions as a source and the other of the two terminals functions as a drain. In general, in an n-channel transistor, a terminal to which a low potential is applied is referred to as a source, and a terminal to which a high potential is applied is referred to as a drain. In contrast, in a p-channel transistor, a terminal to which a low potential is applied is referred to as a drain, and a terminal to which a high potential is applied is referred to as a source. In the following description, to clarify a circuit structure and circuit operation, one of two terminals of a transistor is fixed as a source and the other of the two terminals is fixed as a drain in some cases. It is needless to say that, depending on a driving method, the magnitude relationship between voltages applied to the terminals of the transistor might be changed, and the source and the drain might be interchanged.

In the following description, to clarify a circuit structure and circuit operation, one of two terminals of a transistor is fixed as a source and the other of the two terminals is fixed as a drain in some cases. In an n-channel transistor, a terminal (electrode) to which an H-level signal and high power supply voltage are mainly input is referred to as a drain, and a terminal (electrode) to which an L-level signal and low power supply voltage are mainly input is referred to as a source. In a p-channel transistor, a terminal (electrode) to which a high-level (H-level) signal and a high power supply potential are mainly input is referred to as a source, and a terminal (electrode) to which a low-level (L-level) signal and a low power supply potential are mainly input is referred to as a drain. It is needless to say that, depending on a driving method, the magnitude relationship between voltages applied to the terminals of the transistor might be changed, and the source and the drain might be interchanged. Thus, in one embodiment of the present invention, the distinction between the source and drain of the transistor is not limited to that described in this specification.

In one embodiment of the present invention, a variety of switches can be used as a switch. The switch is conducting or not conducting (is turned on or off) to determine whether current flows. Alternatively, the switch has a function of determining and changing a current path. For example, the switch has a function of determining whether current can flow through a path 1 or a path 2 and switching the paths. Examples of the switch include an electrical switch and a mechanical switch. That is, any element can be used as a switch as long as it can control current, without limitation to a certain element. Examples of the switch include a transistor (e.g., a bipolar transistor or a metal-oxide-semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined. An example of a mechanical switch is a switch formed using a micro electro mechanical system (MEMS) technology, such as a digital micromirror device (DMD). The switch includes an electrode that can be moved mechanically, and operates to control conduction and non-conduction with the movement of the electrode.

In one embodiment of the present invention, there is no particular limitation on the device structure of a capacitor intentionally provided as an element. For example, either a MIM capacitor or a MOS capacitor can be used.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification, trigonal and rhombohedral crystal systems are included in a hexagonal crystal system.

In this specification, the same portions or portions having similar functions in the drawings used for the description of embodiments of the present invention are denoted by the same reference numerals, and the description thereof is not repeated in some cases.

In this specification, the clock signal CLK is abbreviated to "a signal CLK," "CLK," or the like in some cases. The same applies to other signals, voltages, potentials, circuits, elements, and the like.

A plurality of embodiments of the present invention are described below, and any of the embodiments can be combined as appropriate. In addition, in the case where some structure examples are described in one embodiment, any of the structure examples can be combined as appropriate.

Embodiment 1

In this embodiment, a PLD is described as an example of a semiconductor device. Here, a multi-context PLD (MC-PLD) is described as an example.

<Configuration Memory>

First, a memory device that can be mounted on an MC-PLD is described. FIG. 1 is a circuit diagram illustrating a structure example of a configuration memory. The configuration memory of the MC-PLD includes at least memory cells the number of which is the same as the number of contexts. FIG. 1 illustrates a memory device that can store a set of data where the number of contexts is two.

<Structure Example of Configuration Memory>

As illustrated in FIG. 1, a configuration memory (MC-CFGM) 10 includes two memory cells (MemC) 11, transistors M10 and M11, and circuits 13 and 20.

The MemC 11 is a memory circuit that can store data. One of two MemCs 11 is a memory cell (MemC[0]) that stores configuration data whose context is "0," and the other is a memory cell (MemC[1]) that stores configuration data whose context is "1."

The node N0 is an output node of the MC-CFGM 10, and a signal out is output to the node N0. The node N1 is an output node of MemC[0], and the node N2 is an output node of MemC[1]. The MC-CFGM 10 includes input nodes a1 to a4. Signals Context[0], Context[1], bw, and rst each having a function of controlling the MC-CFGM 10 are input to the input nodes a1 to a4, respectively.

Here, to facilitate understanding of a circuit structure or circuit operation, a source and a drain of a transistor are distinguished from each other. As described above, the source and the drain of the transistor might be interchanged depending on a potential applied to the transistor or the conductivity type of the transistor.

The transistors M10 and M11 can function as path transistors. The transistor M10 functions as a switch that can control conduction between the nodes N1 and N0. A gate of the transistor M10 is connected to the circuit 20. A source of the transistor M10 is connected to the node N1. A drain of the transistor M10 is connected to the node N0. The transistor M11 functions as a switch that can control conduction between the nodes N2 and N0. A gate of the transistor M11 is connected to the circuit 20. A source of the transistor M11 is connected to the node N2. A drain of the transistor M11 is connected to the node N0.

The circuit 13 can function as a circuit (reset circuit) that sets the potential level of the node N0 at an H level or an L level. Here, the circuit 13 resets the potential level of the node N0 at an L level. The circuit 13 includes a transistor M13. The transistor M13 functions as a switch that can control conduction between the node N0 and a wiring to which a low power supply potential VSS1 is supplied. A gate of the transistor M13 is connected to the node a4. A source of the transistor M13 is connected to the wiring to which VSS1 is supplied. A drain of the transistor M13 is connected to the node N0.

The circuit 20 has a function of controlling the on or off state of each of the transistors M10 and M11. In other words, the circuit 20 can be regarded as a circuit having a function of context switch and can be referred to as a context selection circuit or a context switch circuit. The circuit 20 includes transistors M20 and M21 and capacitors C20 and C21.

A gate of the transistor M20 is connected to the node a3. A source of the transistor M20 is connected to the gate (node N3) of the transistor M10. A drain of the transistor M20 is connected to the node a1. A gate of the transistor M21 is connected to the node a3. A source of the transistor M21 is connected to the gate (node N4) of the transistor M11. A drain of the transistor M21 is connected to the node a2. The transistor M20 functions as a switch that controls conduction between the nodes a1 and N3, and the transistor M21 functions as a switch that controls conduction between the nodes a2 and N4.

The capacitor C20 can function as a storage capacitor for holding the potential of the node N3. One of two terminals of the capacitor C20 is connected to the node N3, and the other is connected to the node N0. The capacitor C21 can function as a capacitor for holding the potential of the node N4. One of two terminals of the capacitor C21 is connected to the node N4, and the other is connected to the node N0.

In the circuit 20, the signals Context[0] and Context[1] can be used as context selection signals for context switch. The signal bw can be used as a signal for controlling the on or off state of each of the transistors M20 and M21. Furthermore, in the circuit 13, the signal rst can be used as a reset signal for controlling operation of resetting the potential of the node N0 at an L level or an H level.

The circuit 20 can be regarded as a circuit that includes circuits for holding a gate potential of a path transistor or supplying a potential to a gate of the path transistor. The number of the circuits is at least the same as the number of contexts (the number of path transistors). In FIG. 1, the circuit 20 includes two such circuits. Specifically, the circuit 20 includes a circuit 21[0] connected to the gate of the transistor M10 and a circuit 21[1] connected to the gate of the transistor M11. Accordingly, as illustrated in FIG. 1, the MC-CFGM 10 can be regarded as a memory device in which the number of the MemCs 11, the number of the path transistors, and the number of the circuits 21 are each at least the same as the number of contexts.

The circuit 21[0] includes the transistor M20 whose on or off state is controlled by the signal bw and the capacitor C20 connected to the gate of the transistor M10. The circuit 21[1] includes the transistor M21 whose on or off state is controlled by the signal bw and the capacitor C21 connected to the gate of the transistor M11. In the circuits 21[0] and 21[1], the transistors M20 and M21 can function as switches that control supply of the signals Context[0] and Context[1] to the gates of the transistors M10 and M11.

<Example of Method for Driving Configuration Memory>

Figure 2:
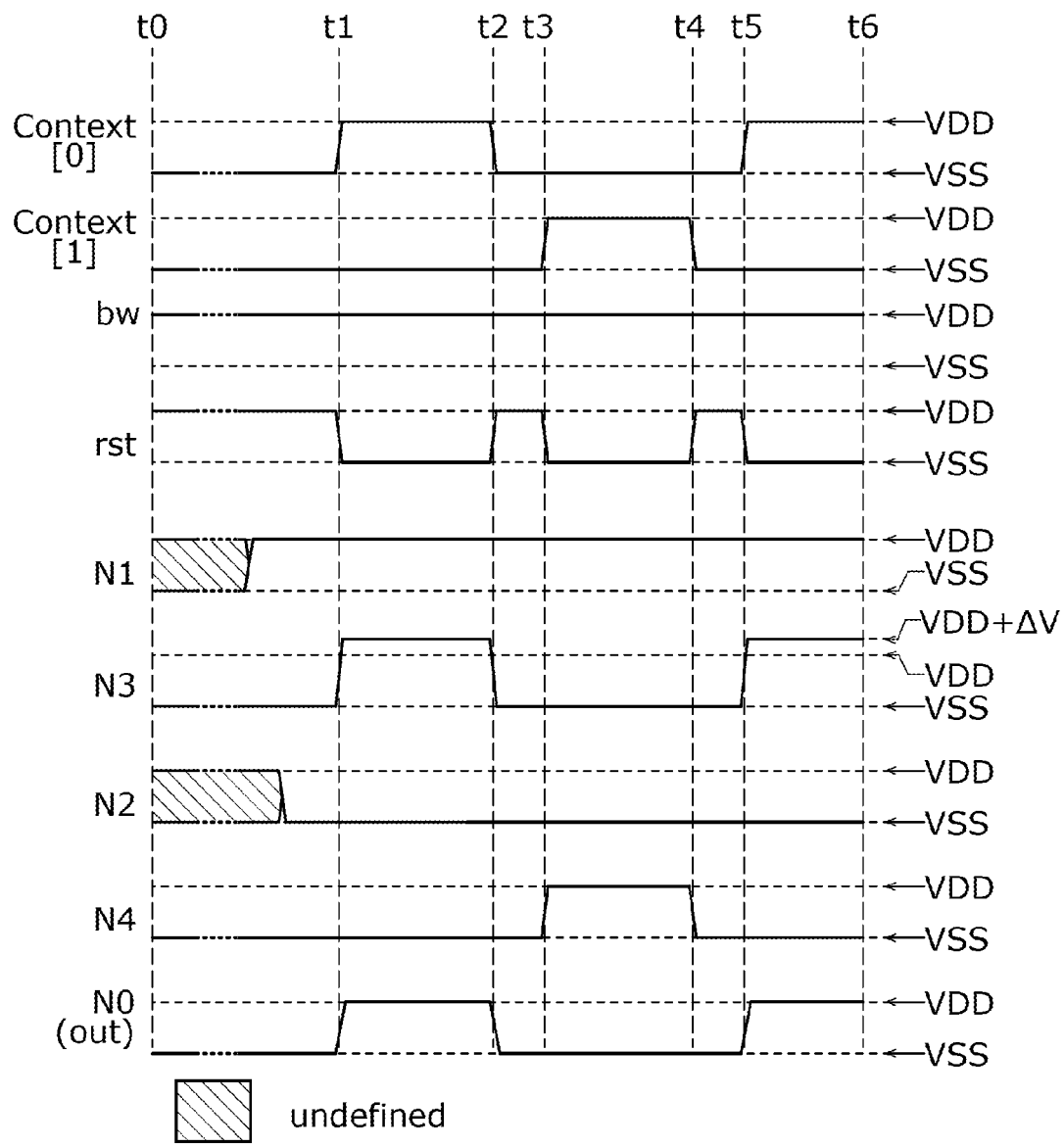
FIG. 2 is a timing chart illustrating an example of a method for driving the configuration memory in FIG. 1.

An example of a method for driving the MC-CFGM 10 is described with reference to FIG. 2. Here, an example of a driving method when the transistors M10, M11, M20, and M21 are n-channel transistors is described. FIG. 2 is a timing chart illustrating an operation example of the MC-CFGM 10. FIG. 2 shows waveforms of the input signals Context[0], Context[1], bw, and rst and changes in the potentials of the nodes N0 to N4. VDD is a high power supply potential and VSS is a low power supply potential. ΔV has a value that is determined by the coupling capacitance or the like of the gate of the transistor M10. Regions of the nodes N1 and N2 indicated by hatching show undefined potential levels (data values). Note that t0, t1, and the like represent times.

In FIG. 2, configuration operation (t0 to t1), context 0 operation (t1 to t2), context 1 operation (t3 to t4), and context 0 operation (t5 to t6) are performed. Note that context operation is a mode in which a PLD with a circuit structure using a specified configuration data set is operated. Context h operation (h is 0 or 1) is a mode in which a PLD with a circuit structure using a context "h" data set is operated, and in the MC-CFGM 10, configuration data stored in MemC[h] is always read.

(Configuration Operation: t0 to t1)

At the time t0, configuration is started. From t0 to t1, rst is set at an H level and the node N0 is fixed to an L level. Context[0] and Context[1] are each fixed to an L level. In this period, configuration data is written to MemC[0] and MemC [1]. Here, data having a data value "1" (H level) is written to MemC[0], and data having a data value "0" (L level) is written to MemC[1]. After writing of the configuration data is terminated, the output node N1 of MemC[0] is set at an H level, and the output node N2 of MemC[1] is fixed to an L level.

In FIG. 2, while the MC-CFGM 10 is operated, bw is at an H level. Thus, the transistors M20 and M21 are on.

(Context 0 Operation: t1 to t2)

At the time t1, the configuration operation is terminated. From t1 to t2, Context[0] is set at an H level, rst is set at an L level, and Context[1] is maintained at an L level. At the time t1, writing of VDD to the node N3 through the transistor M20 is started, and writing of an L-level potential to the node N4 through the transistor M21 is started. Thus, the on-state resistance of the transistor M10 is decreased, and the on-state resistance of the transistor M11 is maintained at a high level. When the potential of the node N3 becomes VDD+ΔV in accordance with an increase in the potential of the node N0, the potential of the node N0 becomes VDD.

When the source-gate voltage of the transistor M20 becomes lower than the threshold voltage in accordance with an increase in the potential of the node N3, the transistor M20 is turned off. This makes the node N3 electrically floating, so that the potential of the node N3 becomes higher than VDD by capacitive coupling of the capacitor C20 or the like (boosting operation). The potential of the node N3 at this time becomes VDD+ΔV. When the potential of the node N3 becomes VDD+ΔV, the transistor M10 is turned on and a potential corresponding to the potential of the node N1 is written to the node N0. The potential ΔV increased by capacitive coupling is preferably higher than or equal to the threshold voltage of the transistor M10. The capacitance or the like of the capacitor C20 may be determined so that the potential ΔV has such a value. Accordingly, in the case where H-level data is written to the node NO, the potential of the node N0 can be VDD without a voltage drop by the threshold voltage of the transistor M10.

In this manner, in the circuit 21[0], the gate potential of the path transistor M10 can be made higher than VDD by the boosting effect at the time of reading H-level data. The same applies to the circuit 21[1]. When the circuit 20 is provided, VDD can be output from the MC-CFGM 10 without the influence of the threshold voltages of the path transistors M10 and M11. As a result, malfunction of the PLD including the MC-CFGM 10 can be inhibited or minimized. Furthermore, the drive voltage of the PLD can be lowered; thus, the total power consumption of the PLD can be reduced while reliability is secured.

(Reset Operation: t2 to t3)

In FIG. 2, reset operation is performed between the context 0 operation and the context 1 operation. The reset operation is performed by setting rst at an H level and setting Context[0] and Context[1] at an L level. The potential of Context[0] is written to the node N3 through the transistor M20, and the potential of Context[1] is written to the node N4 through the transistor M21. Thus, the nodes N3 and N4 are set at an L level. An L-level potential is written to the node N0 through the transistor M13. The reset operation sets the output signal out of the MC-CFGM 10 at an L level.

(Context 1 Operation: t3 to t4)

From t3 to t4, Context[1] is set at an H level, rst is set at an L level, and Context[0] is maintained at an L level. At the time t3, Context[1] is set at an H level (Context[0] is maintained at an L level) and the rst signal is set at an L level, so that the context 1 operation is started.

The node N3 is maintained at an L level, and the potential of the node N4 is increased to an H level. Thus, the transistor M10 is turned off and the transistor M11 is turned on. Accordingly, the potential of the node N2 is written to the node N0. The reset operation sets the nodes N2 and N0 at an L level; thus, the output signal out from the node N0 is not changed.

(Reset Operation: t4 to t5)

The reset operation is performed again, and the nodes N0, N3, and N4 are set at an L level.

(Context 0 Operation: t5 to t6)

Through the context 0 operation, the potential of the node N3 becomes VDD+ΔV, the node N4 is maintained at an L level, and the potential of the node N0 becomes VDD.

Figure 9:
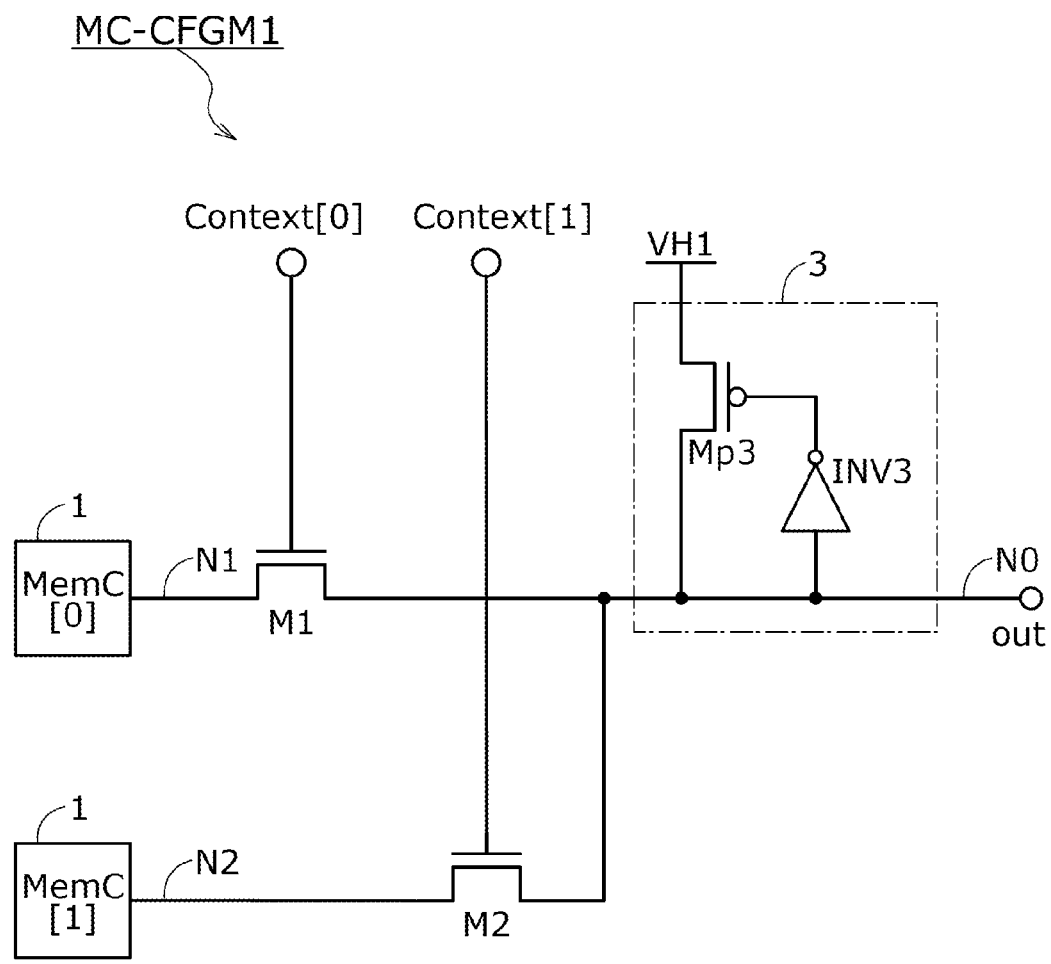
FIG. 9 is a circuit diagram illustrating a structure example of a multi-context configuration memory.

As described above, the circuit 20 has a context switch function and a function of inhibiting a decrease in the potential of the node N0 due to the threshold voltages of the path transistors M10 and M11 as in the circuit 3 of FIG. 9.

In the example of the driving method of FIG. 2, in the context operation, when data read from the MemC 11 is at an H level, the transistors M20 and M21 are turned off, so that the nodes N3 and N4 become electrically floating. Thus, to inhibit voltage drops in the nodes N3 and N4 as much as possible, the transistors M20 and M21 preferably have extremely low leakage current. An example of a transistor having low leakage current is an OS transistor. Here, a transistor including a channel in an oxide semiconductor layer is referred to as an OS transistor.

The OS transistor has extremely high resistance in an off-state (off-state resistance). In other words, the OS transistor has extremely low leakage current in an off-state (off-state current). Extremely low off-state current means that off-state current per micrometer of channel width is lower than or equal to 100 zA. Since the off-state current is preferably as low as possible, the normalized off-state current is preferably lower than or equal to 10 zA/μm ($10 \times 10^{-21}$ A/μm) or lower than or equal to 1 zA/μm ($1 \times 10^{-21}$ A/μm), more preferably lower than or equal to 10 yA/μm ($10 \times 10^{-24}$ A/μm). The off-state current of the OS transistor is extremely low because an oxide semiconductor used for a channel has a wider bandgap (higher than or equal to 3.0 eV) than a Group 14 semiconductor such as Si or Ge. Consequently, the OS transistor has low leakage current due to thermal excitation and extremely low off-state current.

The OS transistor can be stacked over a transistor formed using a semiconductor substrate (e.g., a Si transistor) or the like. For example, when the transistors M20 and M21 are OS transistors and the transistors M10, M11, and M13 are Si transistors in the MC-CFGM 10, area overhead due to the circuit 20 provided in the MC-CFGM 10 can be reduced.

<Control Signal Generation Circuit>

Figure 3:
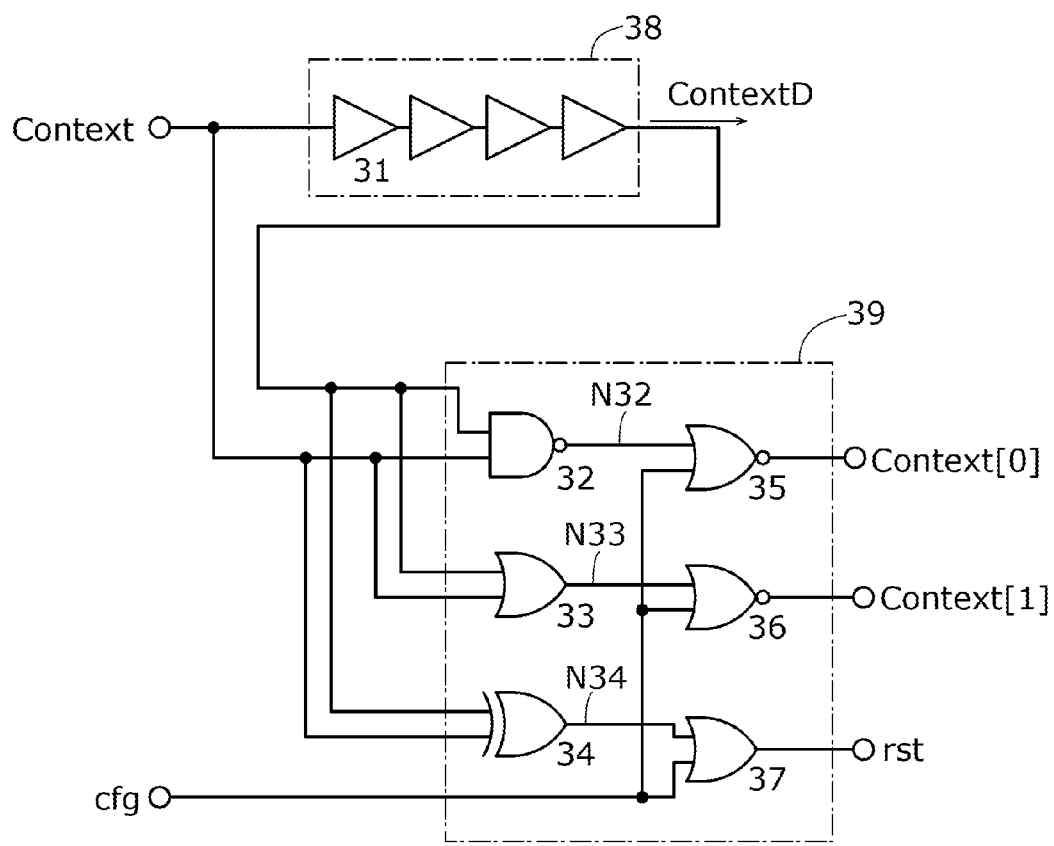
FIG. 3 is a circuit diagram illustrating a structure example of a circuit having a function of generating a signal.

In the example of the driving method of FIG. 2, any one of the signal rst that controls the reset operation and the signals Context[0] and Context[1] that control context selection is set at an H level. FIG. 3 is an example of a circuit that can generate such a signal.

A circuit 30 in FIG. 3 includes circuits 38 and 39. The circuit 30 can generate the signals Context[0], Context[1], and rst from input signals Context and cfg.

The circuit 38 has a function of generating a delay signal of the input signal (here, Context). The circuit 38 can include, for example, one buffer circuit 31 or a plurality of cascaded buffer circuits 31. The signal Context delayed in the circuit 38 is referred to as a signal ContextD.

The circuit 39 functions as a logic portion having a logical operation function of the input signals Context and cfg. In FIG. 3, the circuit 39 includes a NAND circuit 32, an OR circuit 33, an EXOR circuit 34, a NOR circuit 35, a NOR circuit 36, and an OR circuit 37.

The signal Context can function as a control signal that controls context operation. The signal cfg can function as a control signal that controls configuration operation. Here, cfg is at an H level only while configuration operation is performed.

An operation example of the circuit 39 is described. A signal having a negative AND (NAND) of Context and ContextD is output to a node N32, and a signal having an OR of Context and ContextD is input to a node N33. A signal having a negative OR (NOR) of the potential of the node N32 and cfg is Context[0], and a signal having a NOR of the potential of the node N33 and cfg is Context[0]. Thus, while cfg is at an H level, Context[0] and Context[1] are at an L level. In the circuit 30, a period during which the signals Context[0] and Context[1] are at an L level for the delay time of ContextD is provided (see FIG. 2). In other words, a period during which configuration data is not read from the MC-CFGM 10 is provided.

A signal having an exclusive OR (EXOR) of Context and ContextD is output to a node N34. The signal rst is generated by obtaining an OR of the potential of the node N34 and cfg. In other words, in a context non-selection period and a configuration operation period (a period during which cfg is at an H level), rst is set at an H level. Accordingly, in these periods, rst can be used as a signal for maintaining the output node N0 of the MC-CFGM 10 at an L level.

FIG. 3 illustrates an example in which the circuit 30 generates two context selection signals (Context[1:0]). In the case where the number of contexts is three or more, the circuit 38 may generate two or more kinds of delay signals of the signal Context. The circuit 39 may perform logical operation of the signal Context, the plurality of delay signals, and the signal cfg and generate context selection signals (Context[k:0], where k is an integer of two or more).

<Structure Example of Configuration Memory>

Figure 4A:
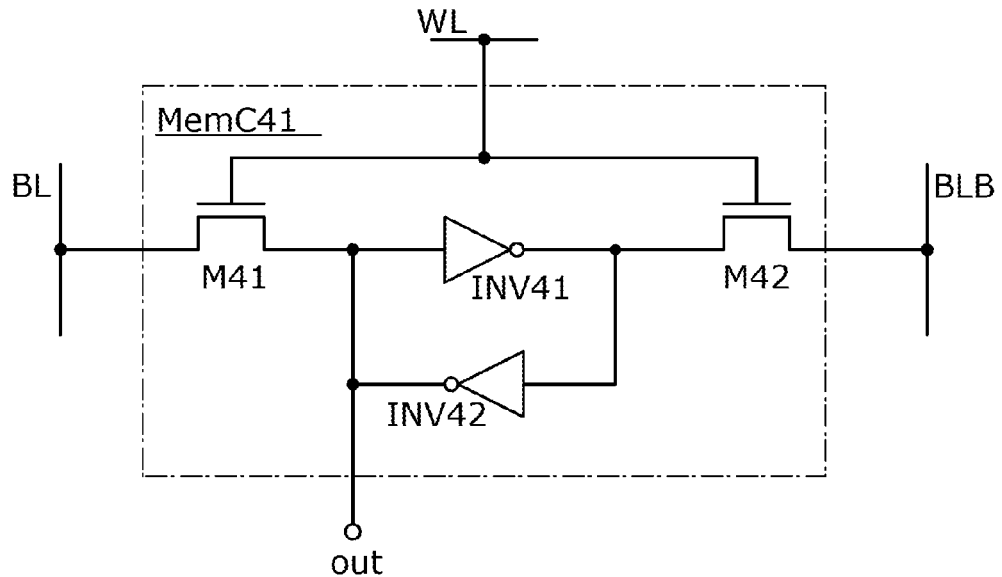
FIGS. 4A and 4B are circuit diagrams each illustrating a structure example of a memory cell.
Figure 4B:
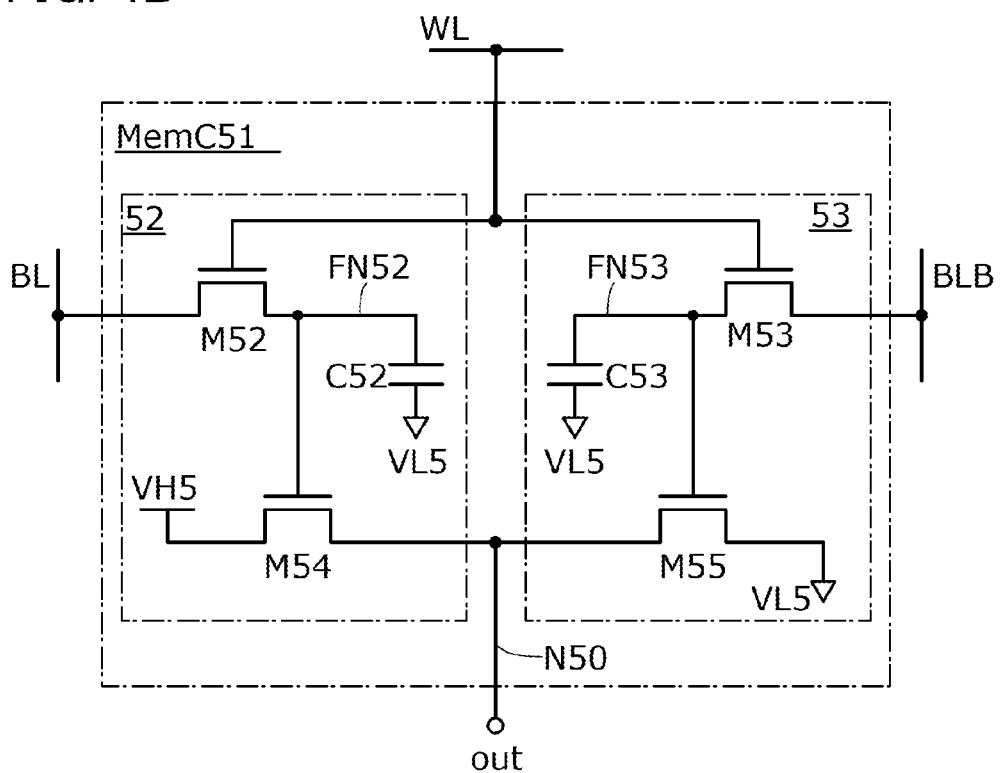

FIGS. 4A and 4B each illustrate a structure example of a memory circuit that can be used as the MemC 11 of the MC-CFGM 10.

FIG. 4A is a circuit diagram illustrating a structure example of an SRAM memory cell (MemC). A MemC 41 includes inverters INV41 and INV42 and transistors M41 and M42. The MemC 41 is connected to wirings BL, BLB, and WL.

The wirings BL and BLB can function as data lines (bit lines). For example, at the time of configuration operation, a data signal corresponding to configuration data is input to the wiring BL, and an inverted signal of the data signal input to the wiring BL is input to the wiring BLB. The wiring WL can function as a selection signal line (word line). For example, a signal (selection signal) for selecting the MemC 41 to which configuration data is written is input to the wiring WL.

FIG. 4B illustrates another structure example of the memory cell. A MemC 51 in FIG. 4B is a memory circuit that stores 1-bit data and is connected to the wirings BL, BLB, and WL, like the MemC 41. In addition, a high power supply potential VH5 and a low power supply potential VL5 are supplied to the MemC 51.

The MemC 51 includes a circuit 52 that can output a data value "1" (H-level data) and a circuit 53 that can output a data value "0" (L-level data). The circuit 52 includes transistors M52 and M54, a capacitor C52, and a node FN52. The circuit 53 includes transistors M53 and M55, a capacitor C53, and a node FN53. The nodes FN52 and FN53 can be electrically floating. The nodes FN52 and FN53 are charge holding portions of the circuits 52 and 53, respectively, and function as nonvolatile data retention portions of the MemC 51.

The structure of the circuit 52 is described. A gate of the transistor M52 is connected to the wiring WL. A source of the transistor M52 is connected to the wiring BL. A drain of the transistor M52 is connected to the node FN52. One of two terminals (nodes) of the capacitor C52 is connected to the node FN52, and the other is connected to a wiring for supplying the potential VL5. A gate of the transistor M54 is connected to the node FN52. A source of the transistor M54 is connected to a wiring for supplying VH5. A drain of the transistor M54 is connected to an output node N50 of the MemC 51.

The circuit 53 has a circuit structure similar to that of the circuit 52. The circuit 53 differs from the circuit 52 in that the transistor M53 is connected to the wiring BLB and that the transistor M55 is connected to a wiring to which VL5 is supplied.

Data is written to the MemC 51 by turning on the transistors M52 and M53. Thus, potentials corresponding to configuration data are written to the nodes FN52 and FN53. In the case where the data value "1" (H-level data) is stored in the MemC 51, an H-level data signal is input to the wiring BL. In the case where the data value "0" (L-level data) is stored in the MemC 51, an L-level data signal is input to the wiring BL.

The data write operation is completed by turning off the transistors M52 and M53. Through the write operation, one of the nodes FN52 and FN53 is set at an H level, and the other is set at an L level. When the node FN52 is at an H level, the output node N50 of the MemC 51 is set at an H level. When the node FN53 is at an H level, the node N50 is set at an L level.

In a context operation period, a change in the potential of the node N50 is preferably inhibited. To inhibit a change in the potential of the node N50, for example, changes in the potentials of the nodes FN52 and FN53 are inhibited. Consequently, the transistors M52 and M53 are preferably transistors having extremely low off-state current, for example, OS transistors. The use of OS transistors makes the MemC 51 function as a nonvolatile memory circuit.

Needless to say, the MemC 11 of the MC-CFGM 10 is not limited to the memory circuits in FIGS. 4A and 4B. For example, a memory circuit that includes a magnetic tunnel junction (MTJ) element or a phase change element can be used.

<FPGA Structure Example>

A structure example of an FPGA is described below as a PLD including the MC-CFGM 10.

<FPGA>

Figure 5:
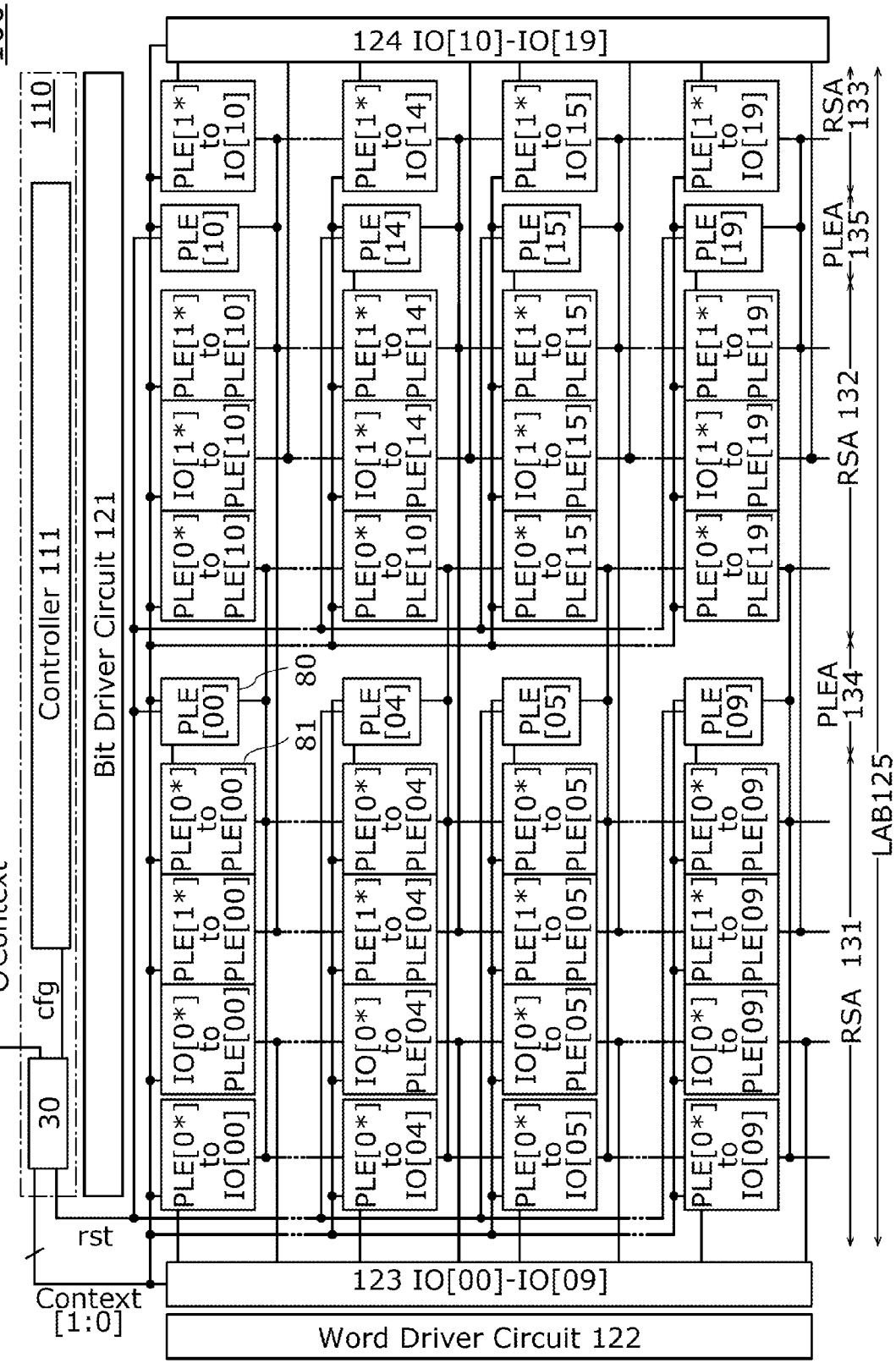
FIG. 5 is a block diagram illustrating an FPGA structure example.

FIG. 5 is a block diagram illustrating a structure example of a multi-context FPGA. An FPGA 100 in FIG. 5 includes a configuration controller 110, a bit driver circuit 121, a word driver circuit 122, input/output portions (IO) 123 and 124, and a logic array block (LAB) 125. The number of contexts in the FPGA 100 is two, and the context can be switched by the signal Context[1:0]. Hereinafter, the bit driver circuit 121 and the word driver circuit 122 are collectively referred to as driver circuits 121 and 122 in some cases.

The configuration controller 110 has a function of controlling the driver circuits 121 and 122, a function of controlling context switch, and the like. The configuration controller 110 includes the circuit 30 (FIG. 3) and a controller 111. The controller 111 has a function of generating control signals of the driver circuits 121 and 122 and the signal cfg, and the like. The circuit 30 generates the signal Context[1:0] and the signal rst from the signal cfg and the signal Context input from the outside of the FPGA 100. The signal Context[1:0] is output to the input/output portions 123 and 124 and the LAB 125. The signal rst is input to the LAB 125.

The bit driver circuit 121 and the word driver circuit 122 each have a function of generating a control signal of a configuration memory included in the LAB 125.

The input/output portions 123 and 124 include a plurality of input/output circuits (IO) depending on the circuit arrangement in the LAB 125. In FIG. 5, the input/output portion 123 includes ten input/output circuits (IO[00] to IO[09]), and the input/output portion 124 includes ten input/output circuits (IO[10] to IO[19]).

The LAB 125 includes routing switch arrays (RSA) 131 to 133 and programmable logic element arrays (PLEA) 134 and 135. In FIG. 5, the FPGA 100 includes twenty programmable logic elements (PLE) 80, the PLEA 134 includes ten PLEs (PLE[00] to PLE[09]), and the PLEA 135 includes ten PLEs (PLE[10] to PLE[19]).

The RSAs 131 to 133 include a plurality of switch circuits (SWC) 81. The SWC 81 functions as a switch circuit that connects wirings. Note that the symbols "PLE[0*] to IO[00]" in a block of the SWC 81 in FIG. 5 indicate that the SWC 81 is a switch circuit that has a function of selecting any one of outputs of PLE[00] to PLE[09] and a function of connecting the output to IO[00] of the input/output portion 123.

<PLE: Programmable Logic Element>

Figure 6:
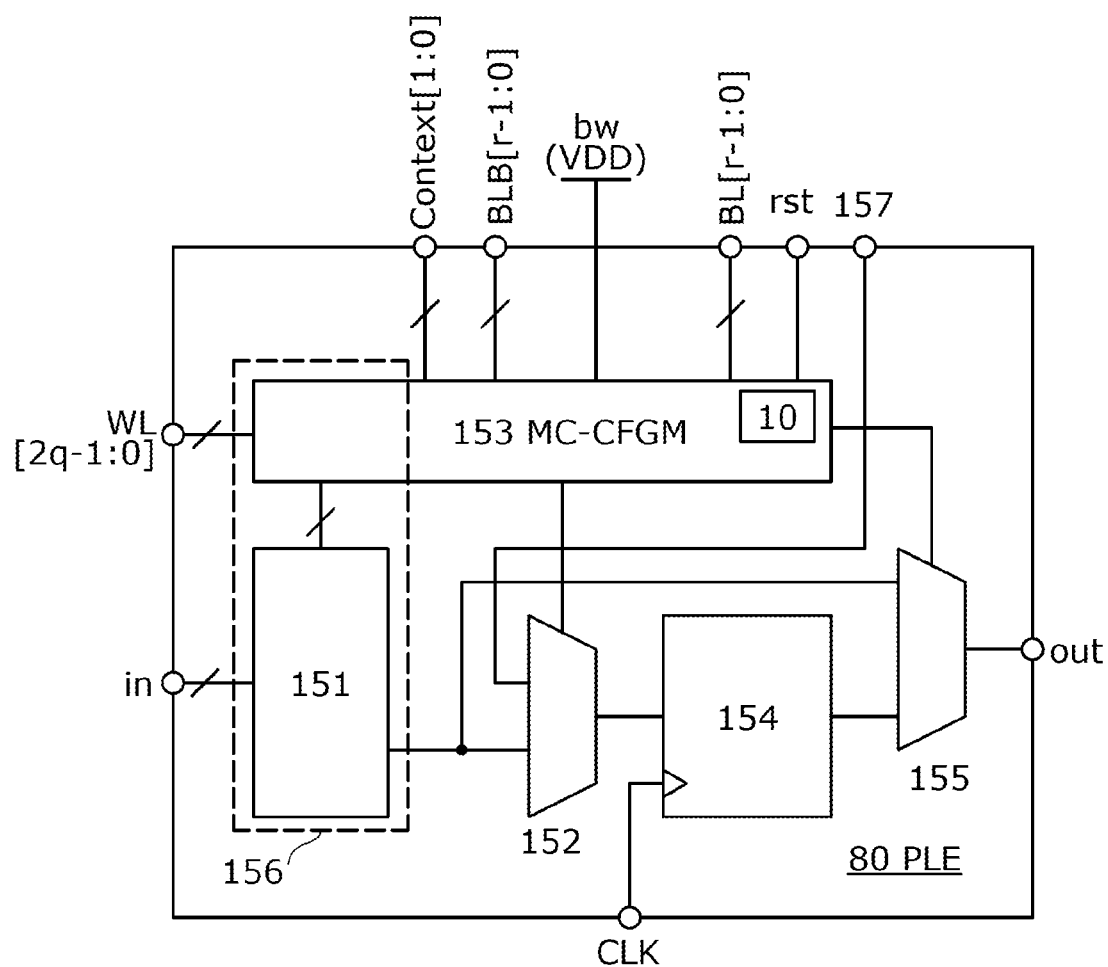
FIG. 6 is a block diagram illustrating a PLE structure example.

FIG. 6 illustrates a structure example of the PLE 80. The PLE 80 includes a flip-flop 154, a multiplexer group 151, multiplexers 152 and 155, and a configuration memory group (MC-CFGM) 153. In FIG. 6, the MC-CFGM 153 includes the MC-CFGMs 10 in q rows and r columns (q and r are each an integer of two or more). A look-up table (LUT) 156 includes the multiplexer group 151 and some of the MC-CFGMs 10 in the MC-CFGM 153.

In the LUT 156, the logical value of an output signal with respect to the logical value of an input signal that is input to an input terminal in is determined in accordance with data including circuit information. The multiplexer 152 has functions of selecting one of the output signal of the LUT 156 and an external input signal 157 in accordance with data stored in the MC-CFGM 10 and outputting the selected signal. An output signal of the multiplexer 152 is input to the flip-flop 154. The flip-flop 154 retains data included in the output signal from the multiplexer 152 or the external input signal 157 and outputs a signal based on the data synchronized with the clock signal CLK. The multiplexer 155 has functions of selecting one of the output signal of the LUT 156 and the output signal of the flip-flop 154 in accordance with data stored in the MC-CFGM 10 and outputting the selected signal. The external input signal 157 is an output signal of the flip-flop 154 included in the adjacent PLE 80.

Note that in FIG. 6, the high power supply potential VDD used in the FPGA 100 is supplied as the signal bw. The wiring WL is connected to the word driver circuit 122, and the wirings BL and BLB are connected to the bit driver circuit 121. The signal Context[1:0] and the signal rst are supplied from the circuit 30.

<SWC: Switch Circuit>

Figure 7:
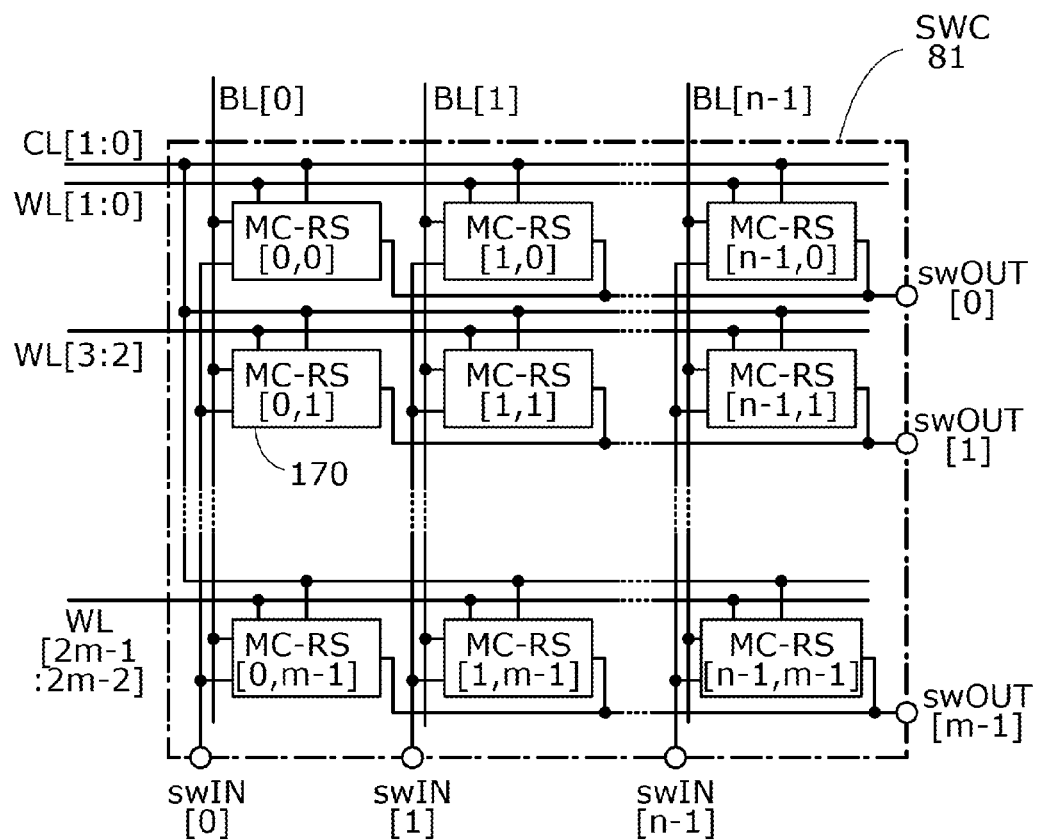
FIG. 7 is a circuit diagram illustrating a structure example of a switch circuit (SWC)

FIG. 7 illustrates a structure example of the SWC 81. The SWC 81 includes routing switches (MC-RS) 170 arranged in m rows and n columns (m and n are each an integer of one or more). The MC-RS 170 is a multi-context reconfigurable switch circuit. The SWC 81 includes n wirings BL (BL[n−1:0]), 2m wirings WL (WL[2m−1:0]), n input nodes swIN (swIN[n−1:0]), m output nodes swOUT (swOUT[m−1:0]), and two wirings CL(CL[1:0]) to which Context[1:0] is input, depending on the arrangement of the MC-RSs 170.

The input node swIN[n−1:0] is connected to the PLE 80 or output nodes of IO circuits in the input/output portions 123 and 124. The output node swOUT[m−1:0] is connected to the PLE 80 or input nodes of the IO circuits in the IOs 123 and 124. The MC-RS 170 has a memory function of storing configuration data. Connection between the input node swIN[n−1:0] and the output node swOUT[m−1:0] is determined by configuration data stored in the MC-RS 170.

(MC-RS)

Figure 8:
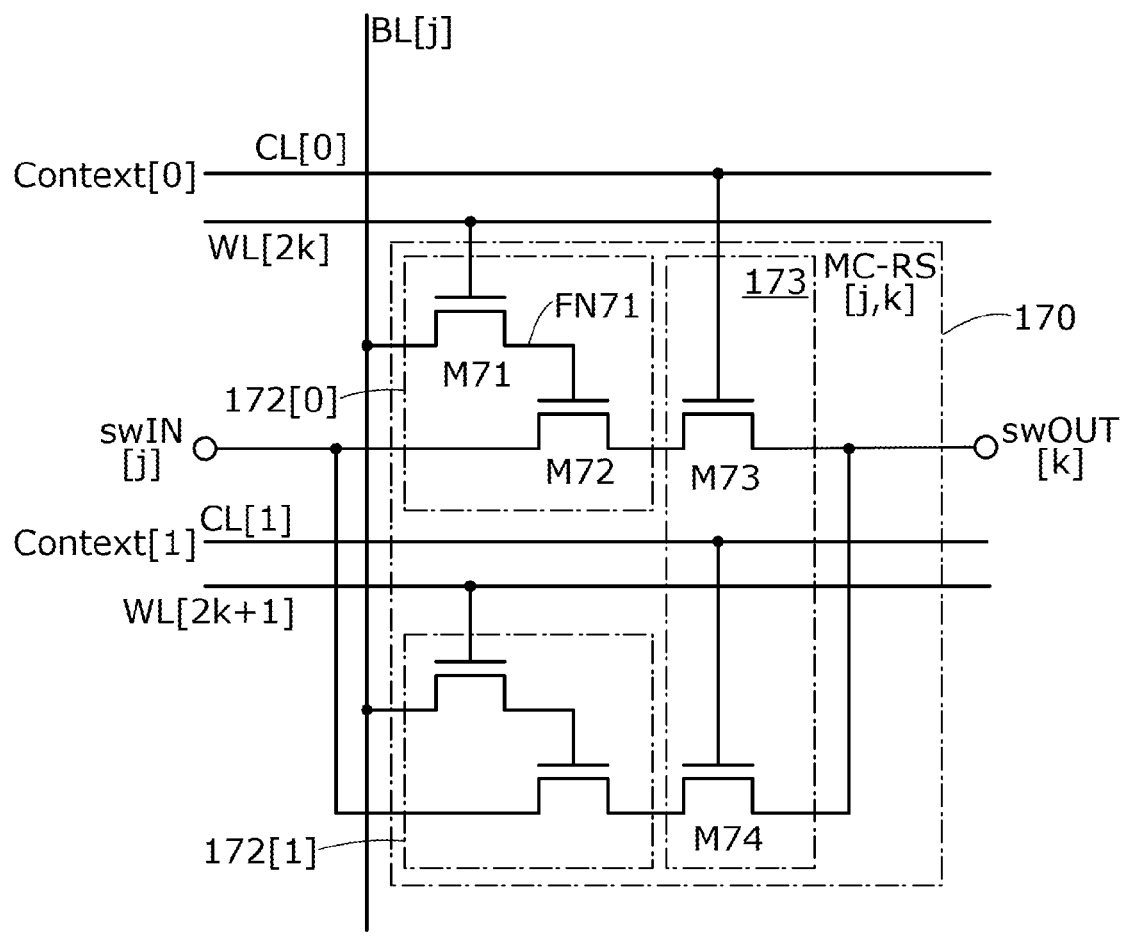
FIG. 8 is a circuit diagram illustrating a structure example of a routing switch (MC-RS)

FIG. 8 illustrates a structure example of the MC-RS 170. In FIG. 8, the MC-RS 170 with an address of [j, k] is typically illustrated. Note that j and k are each an integer, and $0 \le j \le n-1$ and $0 \le k \le m-1$ are satisfied.

The MC-RS 170 includes two circuits 172 and a circuit 173. The number of the circuits 172 is the same as the number of contexts. The circuit 172 is a programmable switch circuit having a function of storing configuration data. In the circuit 172, a transistor M72 functions as a path transistor. Configuration data is written to a gate (node FN71) of the transistor M72. The configuration data is written by controlling a transistor M71.

The circuit 173 functions as a context switch circuit. The circuit 173 includes transistors functioning as switches the number of which is the same as the number of contexts. Here, the circuit 173 includes transistors M73 and M74. The on or off state of the transistor M73 is controlled by the signal Context[0], and the on or off state of the transistor M74 is controlled by the signal Context[1]. For example, in the context 0 operation, the transistor M73 is turned on. The transistor M72 is also turned on when the node FN71 of the circuit 172[0] is at an H level; thus, an input node swIN[j] and an output node swOUT[k] are electrically connected.

In the MC-RS 170, configuration data is written and retained by controlling the on or off state of the transistor M71. Thus, to inhibit a change in the potential of the node FN71 while a potential based on configuration data is held in the node FN71, the transistor M71 preferably has low off-state current. For example, the transistor M71 may be an OS transistor.

Embodiment 2

In this embodiment, the device structure of a semiconductor device is described. As described in Embodiment 1, the semiconductor device can include a Si transistor and an OS transistor. In such a structure example, the semiconductor device can be downsized by stacking the Si transistor and the OS transistor. A structure example of a semiconductor device with such a layered structure is described with reference to FIG. 10 and FIG. 11.

Figure 10:
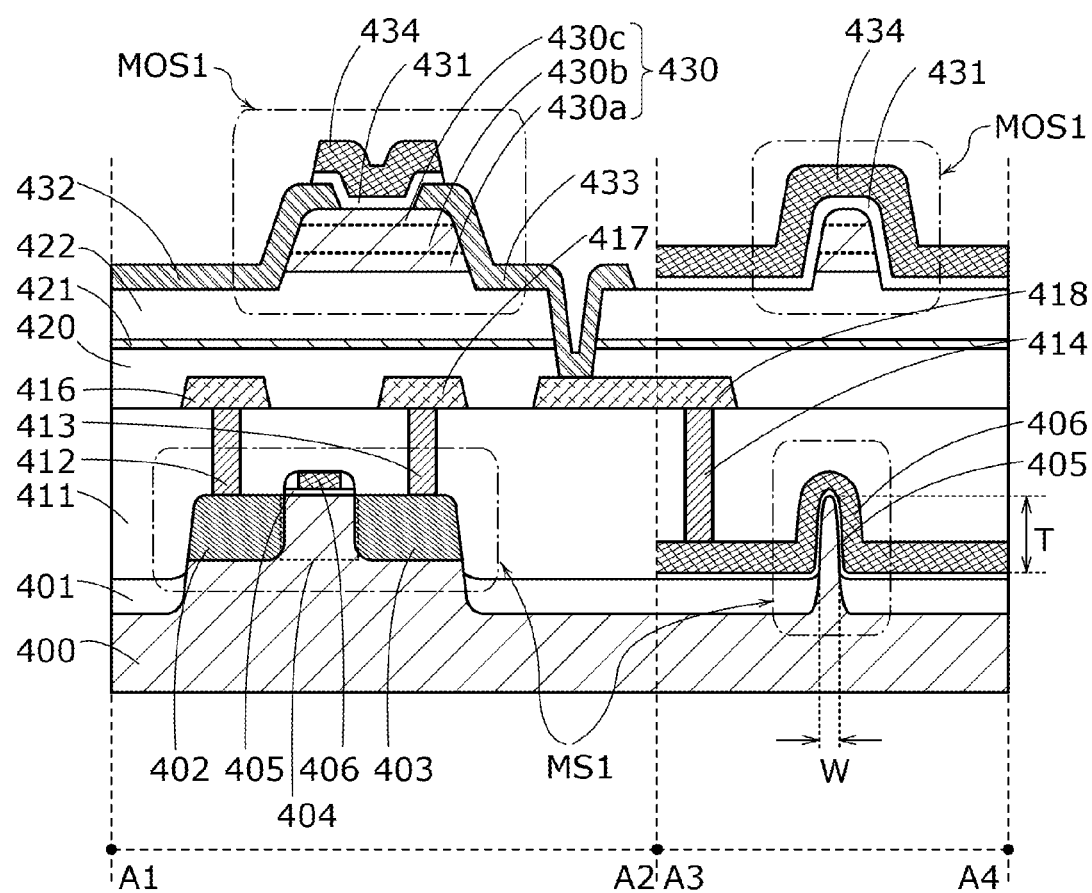
FIG. 10 is a cross-sectional view illustrating a structure example of a semiconductor device.
Figure 11:
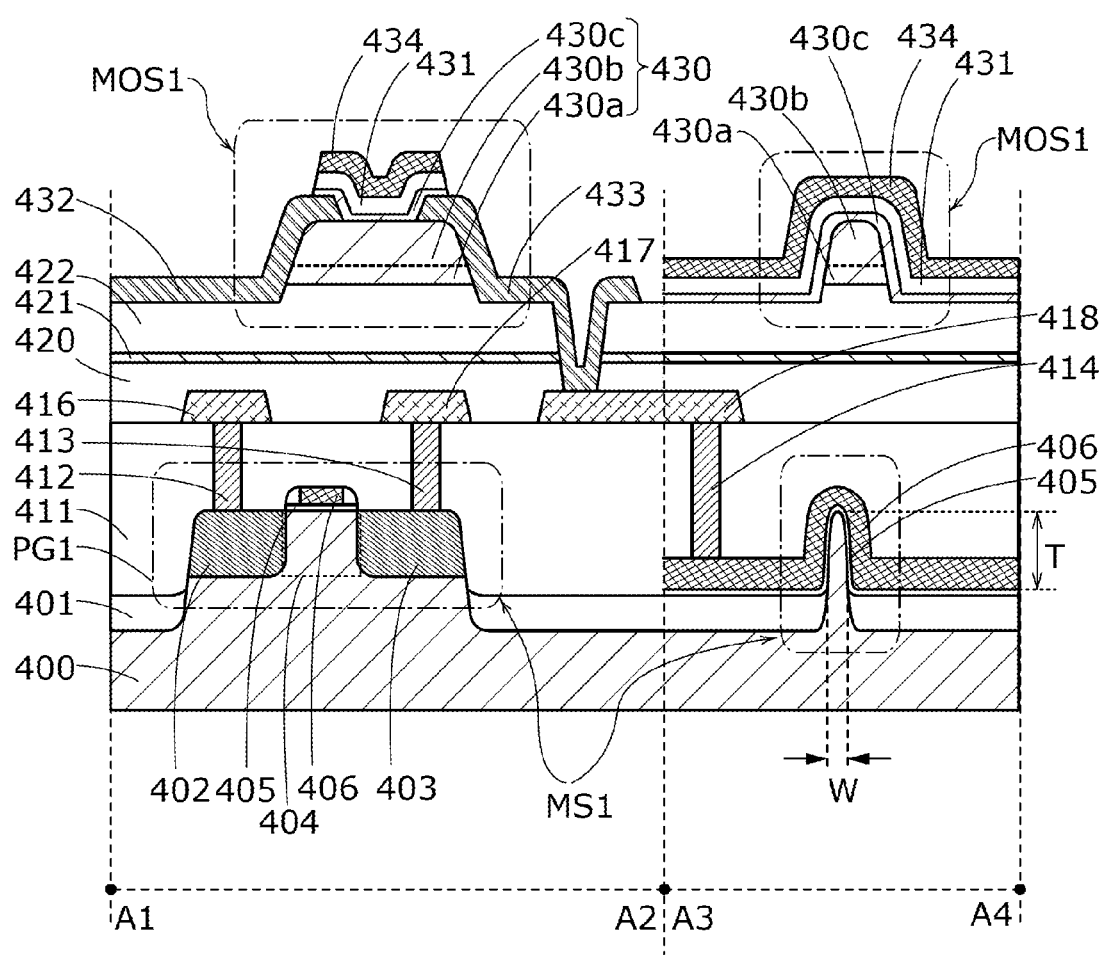
FIG. 11 is a cross-sectional view illustrating a structure example of a semiconductor device.

FIG. 10 illustrates an example of part of the cross-sectional structure of the semiconductor device. Note that in FIG. 10, transistors MOS1 and MS1 are typically illustrated as semiconductor devices. In FIG. 10, the transistor MOS1 is an OS transistor that includes an oxide semiconductor layer where a channel formation region is provided, and the transistor MS1 includes a channel formation region on a single crystal silicon substrate. The transistor MOS1 is formed over the transistor MS1.

Note that the cross-sectional structures of the transistors MOS1 and MS1 in a channel length direction are shown in a section indicated by broken line A1-A2, and the cross-sectional structures of the transistors MOS1 and MS1 in a channel width direction are shown in a section indicated by broken line A3-A4. In an actual semiconductor device, the channel length direction of the transistor MOS1 is not necessarily aligned with the channel length direction of the transistor MS1. The channel length direction denotes a direction in which carriers move at the shortest distance between a pair of impurity regions serving as a source region and a drain region. The channel width direction denotes a direction perpendicular to the channel length direction.

The transistor MS1 may include a channel formation region in a semiconductor film or a semiconductor substrate of silicon, germanium, or the like in an amorphous, microcrystalline, polycrystalline, or single crystal state. Alternatively, the transistor MS1 may include a channel formation region in an oxide semiconductor film or an oxide semiconductor substrate. In the case where the transistors each include a channel formation region in an oxide semiconductor film or an oxide semiconductor substrate, the transistor MOS1 is not necessarily stacked over the transistor MS1, and the transistors MOS1 and MS1 may be formed in the same layer.

In the case where the transistor MS1 is formed using a silicon thin film, any of the following can be used for the thin film: amorphous silicon formed by sputtering or chemical vapor deposition (CVD) such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor MS1 is formed can be, for example, a silicon substrate, a germanium substrate, or a silicon germanium substrate. In FIG. 10, a single crystal silicon substrate is used as the substrate 400.

The transistor MS1 is electrically isolated by element isolation. Trench isolation (e.g., shallow trench isolation (STI)) or the like can be used as the element isolation. In FIG. 10, the transistor MS1 is electrically isolated by trench isolation. Specifically, in FIG. 10, the transistor MS1 is electrically isolated by element isolation using an element isolation region 401 formed in such a manner that an insulator including silicon oxide or the like is buried in a trench formed in the substrate 400 by etching or the like and then the insulator is removed partly by etching or the like.

On a projection of the substrate 400 in a region other than the trench, impurity regions 402 and 403 of the transistor MS1 and a channel formation region 404 positioned between the impurity regions 402 and 403 are provided. The transistor MS1 includes an insulating film 405 covering the channel formation region 404 and a gate electrode 406 overlapping with the channel formation region 404 with the insulating film 405 positioned therebetween.

In the transistor MS1, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, the area of the transistor MS1 in the substrate can be small, and the amount of transfer of carriers in the transistor MS1 can be increased. As a result, the on-state current and field-effect mobility of the transistor MS1 are increased. In particular, if the width (channel width) of the projection in the channel formation region 404 in a channel width direction is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of the transistor MS1 can be further increased.

Note that in the case of the transistor MS1 formed using a bulk semiconductor substrate, the aspect ratio is preferably 0.5 or higher, more preferably 1 or higher.

An insulating film 411 is provided over the transistor MS1. Openings are formed in the insulating film 411. In the openings, conductive films 412 and 413 electrically connected to the impurity regions 402 and 403, respectively, and a conductive film 414 electrically connected to the gate electrode 406 are formed.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421. The transistor MOS1 is provided over the insulating film 422.

The transistor MOS1 includes, over the insulating film 422, a semiconductor film 430 including an oxide semiconductor; conductive films 432 and 433 that are electrically connected to the semiconductor film 430 and function as a source electrode and a drain electrode; a gate insulating film 431 covering the semiconductor film 430; and a gate electrode 434 overlapping with the semiconductor film 430 with the gate insulating film 431 positioned therebetween. Note that an opening is provided in the insulating films 420 to 422, and the conductive film 433 is connected to the conductive film 418 through the opening.

The transistor MOS1 may further include a gate electrode (back gate electrode) overlapping with the semiconductor film 430 with the insulating film 422 positioned therebetween. When the transistor MOS1 includes a pair of gate electrodes, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 10, the transistor MOS1 has a single-gate structure where one channel formation region corresponding to one gate electrode 434 is provided. The structure of the transistor MOS1 is not limited to this structure. For example, the transistor MOS1 may have a multi-channel structure where a plurality of channel formation regions are formed in one oxide semiconductor layer.

In the transistor MOS1, the semiconductor film 430 includes oxide semiconductor films 430a to 430c stacked sequentially over the insulating film 422. Note that in one embodiment of the present invention, the semiconductor film 430 of the transistor MOS1 may be formed using a single-layer metal oxide film.

The insulating film 422 preferably has a function of supplying part of oxygen to the oxide semiconductor films 430a to 430c by heating. In addition, the insulating film 422 preferably has few defects, typically, spin density at g=2.001 due to a dangling bond of silicon is preferably lower than or equal to $1 \times 10^{18}$ spins/cm$^3$ when measured by electron spin resonance (ESR) spectroscopy.

The insulating film 422 is preferably formed using an oxide to have a function of supplying part of oxygen to the oxide semiconductor films 430a to 430c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by plasma-enhanced CVD, sputtering, or the like.

Note that in this specification, oxynitride contains more oxygen than nitrogen, and nitride oxide contains more nitrogen than oxygen.

In the transistor MOS1, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. An electric field applied to the end portions can be controlled by controlling the potential of the gate electrode 434 because the end portions of the oxide semiconductor film 430b that do not overlap with the conductive films 432 and 433 overlap with the gate electrode 434 in the transistor MOS1 in FIG. 10. Consequently, current that flows between the conductive films 432 and 433 through the end portions of the oxide semiconductor film 430b can be controlled by the potential applied to the gate electrode 434. Such a structure of the transistor MOS1 is referred to as a surrounded channel (s-channel) structure.

With the s-channel structure, specifically, when a potential at which the transistor MOS1 is turned off is supplied to the gate electrode 434, the amount of off-state current that flows between the conductive films 432 and 433 through the end portions can be reduced. For this reason, in the transistor MOS1, even when the distance between the conductive films 432 and 433 at the end portions of the oxide semiconductor film 430b is reduced as a result of reducing the channel length to obtain high on-state current, the transistor MOS1 can have low off-state current. Consequently, with the short channel length, the transistor MOS1 can have high on-state current when it is on and have low off-state current when it is off.

With the s-channel structure, specifically, when a potential at which the transistor MOS1 is turned on is supplied to the gate electrode 434, the amount of current that flows between the conductive films 432 and 433 through the end portions of the oxide semiconductor film 430b can be increased. The current contributes to an increase in the field-effect mobility and on-state current of the transistor MOS1. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor MOS1. As a result, the on-state current of the transistor MOS1 is increased, and the field-effect mobility is increased. Typically, the field-effect mobility is greater than or equal to 10 cm$^2$/V·s or greater than or equal to 20 cm$^2$N·s. Note that here, the field-effect mobility is not an approximate value of the mobility as the physical property of the oxide semiconductor film but is an index of current drive capability and the apparent field-effect mobility of a saturation region of the transistor.

Although the device structure example of the semiconductor device is illustrated in FIG. 10, the device structure is not limited to this structure. For example, a structure illustrated in FIG. 11 can be employed.

Embodiment 3

In this embodiment, an OS transistor, an oxide semiconductor, and the like are described.

<Oxide Semiconductor Structure>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure.

For this reason, an a-like OS has physical properties similar to those of an amorphous oxide semiconductor.

<CAAC-OS>

A CAAC-OS is an oxide semiconductor having a plurality of c-axis aligned crystal parts.

When a combined analysis image (also referred to as a high-resolution TEM image) of a bright-field image and a diffraction pattern of a CAAC-OS is observed by a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur. The high-resolution TEM image obtained with a spherical aberration corrector function is particularly referred to as a Cs-corrected high-resolution TEM image.

According to the Cs-corrected high-resolution TEM image of the CAAC-OS observed in a direction parallel to a sample surface, metal atoms are arranged in a layered manner in the crystal parts. Each metal atom layer has a configuration reflecting unevenness of a surface over which a CAAC-OS film is formed (hereinafter the surface is referred to as a formation surface) or a top surface of the CAAC-OS, and is arranged parallel to the formation surface or the top surface of the CAAC-OS. The Cs-corrected high-resolution TEM image indicates that the size of a crystal part is approximately 1 to 3 nm and that the size of a space caused by tilt of the crystal parts is approximately 0.8 nm. Therefore, the crystal part can also be referred to as a nanocrystal (nc). The CAAC-OS can be referred to as an oxide semiconductor including c-axis aligned nanocrystals (CANC).

A Cs-corrected high-resolution TEM image of a plane of the CAAC-OS observed from a direction substantially perpendicular to the sample surface shows that metal atoms are arranged in a triangular, quadrangular, or hexagonal configuration in a crystal part. However, there is no regularity of arrangement of metal atoms between different crystal parts.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31°. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

In structural analysis of the CAAC-OS by an out-of-plane method, another peak might appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in the direction parallel to the sample surface, a diffraction pattern (also referred to as a selected-area transmission electron diffraction pattern) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is observed when an electron beam with a probe diameter of 300 nm is incident on the same sample in a direction perpendicular to the sample surface. Thus, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (e.g., silicon) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, more preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<Nc-OS>

An nc-OS has a region in which a crystal part is observed and a region in which a crystal part is not observed clearly in a high-resolution TEM image. In most cases, a crystal part in the nc-OS is greater than or equal to 1 nm and less than or equal to 100 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, a grain boundary cannot be found clearly in some cases.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern of the nc-OS obtained by using an electron beam having a probe diameter larger than the diameter of a crystal part (e.g., larger than or equal to 50 nm). Meanwhile, spots are shown in a nanobeam electron diffraction pattern of the nc-OS obtained by using an electron beam having a probe diameter close to or smaller than the diameter of a crystal part. Furthermore, in a nanobeam electron diffraction pattern of the nc-OS, regions with high luminance in a circular (ring) pattern are observed in some cases. Moreover, a plurality of spots are shown in a ring-like region in some cases.

Since there is no regularity of crystal orientation between the crystal parts (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different crystal parts in the nc-OS; thus, the nc-OS has a higher density of defect states than the CAAC-OS.

<A-Like OS>

An a-like OS is an oxide semiconductor having a structure between the nc-OS and the amorphous oxide semiconductor.

In a high-resolution TEM image of the a-like OS, a void may be seen. Furthermore, in the high-resolution TEM image, there are a region where a crystal part is clearly observed and a region where a crystal part is not observed.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. A semiconductor region of an OS transistor may be a stacked film including two or more of an amorphous oxide semiconductor, an a-like OS, an nc-OS, and a CAAC-OS, for example.

Embodiment 4

In this embodiment, an example of a method for manufacturing a semiconductor device is described.

Typical examples of a method for forming a conductive film and a semiconductor film included in a semiconductor device include sputtering and plasma-enhanced CVD. The conductive film and the semiconductor film may be formed by another method, for example, thermal CVD. Metal organic chemical vapor deposition (MOCVD) or atomic layer deposition (ALD) can be employed as thermal CVD, for example.

Thermal CVD does not generate plasma and thus has an advantage that no defect due to plasma damage is caused. Deposition by thermal CVD may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by ALD may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, ALD makes it possible to accurately adjust thickness and thus is suitable for manufacturing a minute FET.

The conductive film and the semiconductor film that are described in the above embodiment can be formed by thermal CVD such as MOCVD or ALD. For example, in the case where an InGaZnO$_X$ (X>0) film is formed, trimethylindium, trimethylgallium, and dimethylzinc are used. Note that the chemical formula of trimethylindium is (CH$_3$)$_3$In. The chemical formula of trimethylgallium is (CH$_3$)$_3$Ga. The chemical formula of dimethylzinc is (CH$_3$)$_2$Zn. Without limitation to the above combination, triethylgallium (chemical formula: (C$_2$H$_5$)$_3$Ga) can be used instead of trimethylgallium and diethylzinc (chemical formula: (C$_2$H$_5$)$_2$Zn) can be used instead of dimethylzinc.

For example, in the case where a tungsten film is formed using a deposition apparatus employing ALD, a WF$_6$ gas and a B$_2$H$_6$ gas are sequentially introduced more than once to form an initial tungsten film, and then a WF$_6$ gas and an H$_2$ gas are introduced at the same time, so that a tungsten film is formed. Note that an SiH$_4$ gas may be used instead of a B$_2$H$_6$ gas.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced more than once to form an InO$_2$ layer, a Ga(CH$_3$)$_3$ gas and an O$_3$ gas are introduced at the same time to form a GaO layer, and then a Zn(CH$_3$)$_2$ gas and an O$_3$ gas are introduced at the same time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing these gases. Note that although an H$_2$O gas that is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Embodiment 5

In this embodiment, examples in which a semiconductor device is used in an electronic component, examples in which a semiconductor device is used in an electronic device including the electronic component, and the like are described.

Figure 12A:
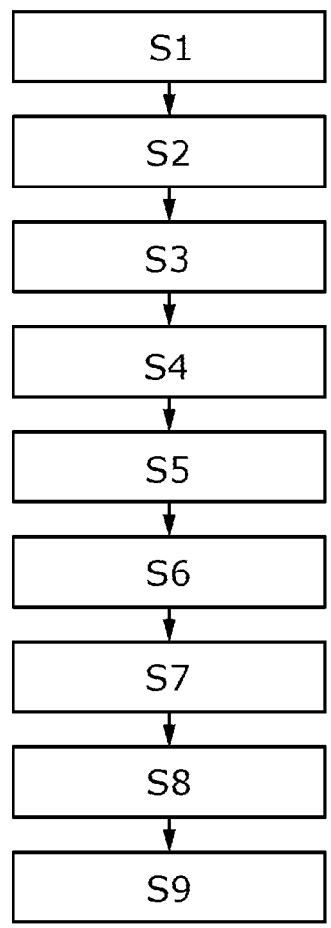
FIG. 12A is a flow chart showing a method for manufacturing an electronic component.

FIG. 12A is a flow chart showing an example of a method for manufacturing a semiconductor device used in an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor can be completed after an assembly process (post-process) by using a plurality of components that can be detached and attached from and to a printed wiring board in combination. The post-process can be finished through each step in FIG. 12A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Then, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 12B:
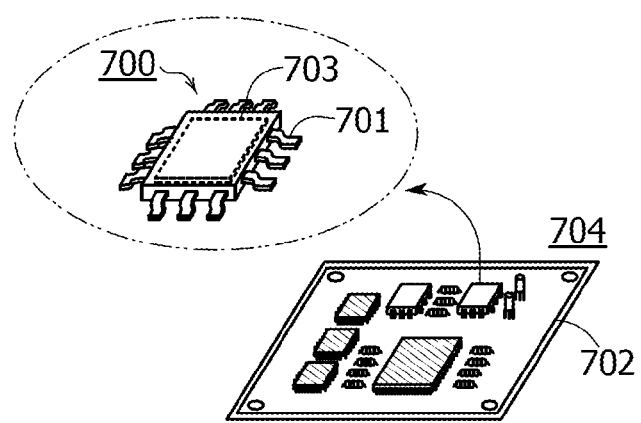
FIG. 12B is a schematic perspective view illustrating a structure example of the electronic component.

FIG. 12B is a schematic perspective view of the completed electronic component. FIG. 12B illustrates a schematic perspective view of a quad flat package (QFP) as an example of the electronic component. As illustrated in FIG. 12B, an electronic component 700 includes a lead 701 and a circuit portion 703. The electronic component 700 is mounted on a printed wiring board 702, for example. When a plurality of electronic components 700 are used in combination and electrically connected to each other over the printed wiring board 702, the electronic components 700 can be mounted on an electronic device. A completed circuit board 704 is provided in the electronic device or the like.

The semiconductor device in Embodiment 1 has a user-programmable circuit structure; thus, the semiconductor device itself can be used as a processor, or the semiconductor device included in a central processing unit (CPU), a microcontroller unit (MCU), or the like can be used as a processor that executes a variety of processings. In the latter case, for example, an electronic component can be formed as a system-on-a-chip (SOC or SoC) in which the semiconductor device in Embodiment 1 and another circuit are mounted on one semiconductor chip (IC chip).

The static and dynamic power consumption of the semiconductor device in Embodiment 1 is reduced, so that the power consumption of a processor including the semiconductor device can also be reduced. The processor can be used as processors of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 13A to 13F illustrate specific examples of these electronic devices.

Figure 13A:
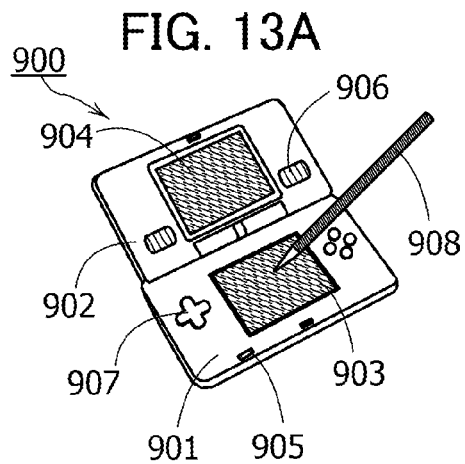
FIGS. 13A to 13F illustrate electronic device examples.

FIG. 13A is an external view illustrating a structure example of a portable game machine. A portable game machine 900 includes a housing 901, a housing 902, a display portion 903, a display portion 904, a microphone 905, a speaker 906, an operation key 907, a stylus 908, and the like.

Figure 13B:
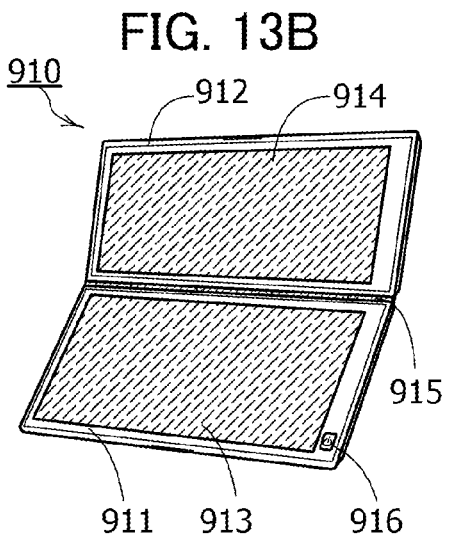

FIG. 13B is an external view illustrating a structure example of a portable information terminal. The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image on the display portion 913 may be switched depending on the angle between the housings 911 and 912 at the joint 915. A display device with a touch panel may be used as the display portion 913 and/or the display portion 914.

Figure 13C:
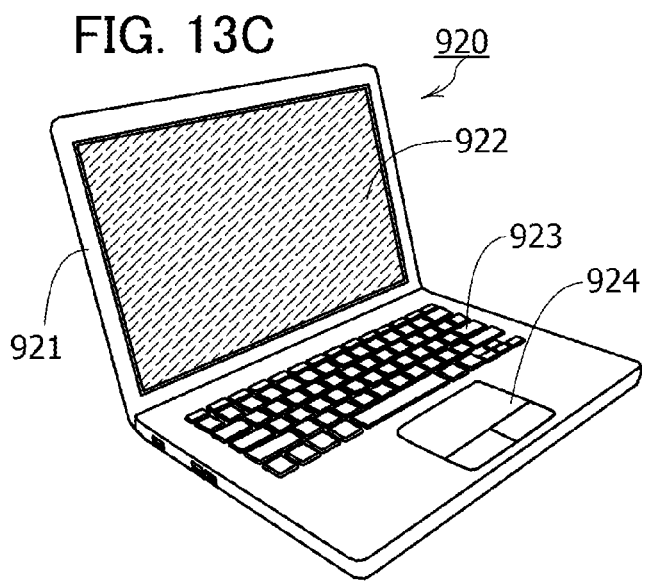

FIG. 13C is an external view illustrating a structure example of a laptop. A personal computer 920 includes a housing 921, a display portion 922, a keyboard 923, a pointing device 924, and the like.

Figure 13D:
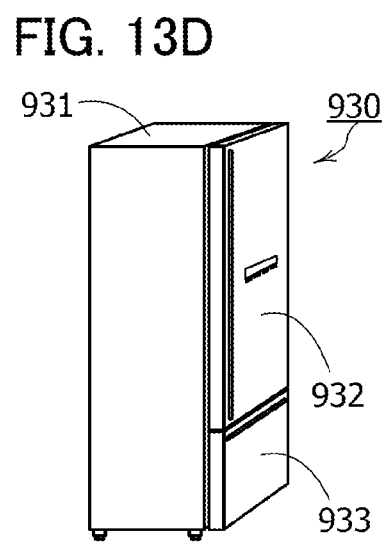

FIG. 13D is an external view illustrating a structure example of an electric refrigerator-freezer. An electric refrigerator-freezer 930 includes a housing 931, a refrigerator door 932, a freezer door 933, and the like.

Figure 13E:
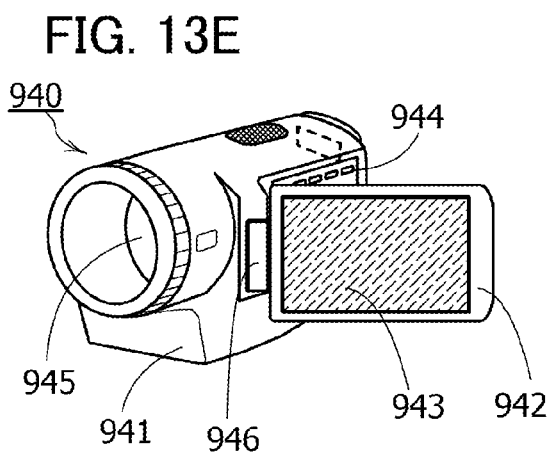

FIG. 13E is an external view illustrating a structure example of a video camera. A video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 13F:
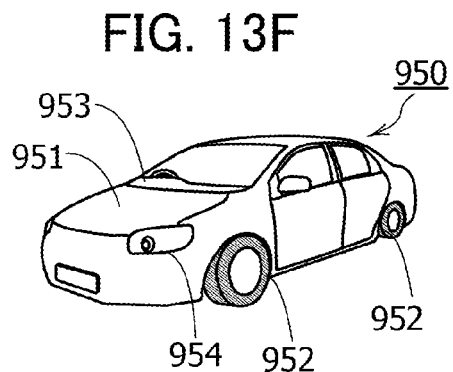

FIG. 13F is an external view illustrating a structure example of a motor vehicle. A motor vehicle 950 includes a car body 951, wheels 952, a dashboard 953, lights 954, and the like.

An electronic component including the semiconductor device described in the above embodiment is provided in each of the electronic devices described in this embodiment. Thus, an electronic device that consumes less power and has smaller size can be provided.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that content that is not specified in any drawing or text in the specification can be excluded from one embodiment of the invention. Alternatively, when the range of a value that is defined by the maximum and minimum values is described, the range is narrowed freely and part of the range is removed, so that one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection in the invention. It can be specified that the circuit does not include a capacitor with a particular connection in the invention. For example, it can be specified that a sixth transistor whose gate is connected to a gate of the third transistor is not included in the invention. It can be specified that a capacitor whose first electrode is connected to the gate of the third transistor is not included in the invention, for example.

As another specific example, when the expression "voltage is preferably higher than or equal to 3 V and lower than or equal to 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than 9 V and higher than 9 V and lower than or equal to 10 V in the invention. Note that even when the expression "a value is preferably in a certain range" or "a value preferably satisfies a certain condition" is used, for example, the value is not limited to the description. In other words, the description of a value that includes a term "preferable", "preferably", or the like does not necessarily limit the value.

As another specific example, when the expression "voltage is preferably 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, when the expression "a film is an insulating film" is used to describe properties of a material, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, when the expression "a film is provided between an A film and a B film" is used to describe a given layered structure, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the present invention is clear when the function of a circuit is specified. Furthermore, it can be determined that one embodiment of the present invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. One embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. One embodiment of the invention is clear.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted. One embodiment of the invention is clear.

This application is based on Japanese Patent Application serial No. 2014-022576 filed with Japan Patent Office on Feb. 7, 2014, the entire contents of which are hereby incorporated by reference.

What is claimed is:

1. A semiconductor device comprising:
   a first output node, and
   k first circuits, where k is an integer of two or more,
       wherein each of the k first circuits includes a first transistor, a second transistor, a capacitor, and a first memory circuit including a second output node,
       wherein k first signals are configured to be input to the different k first circuits, respectively,
       wherein, in each of the k first circuits:
       one of terminals of the capacitor is electrically connected to the first output node,
       the other of the terminals of the capacitor is electrically connected to a third output node,
       the first transistor is configured to control conduction between the first output node and the second output node, and
       the second transistor is configured to control supply of one of the k first signals to a gate of the first transistor.

2. The semiconductor device according to claim 1, wherein in the k first circuits, an on or off state of the second transistor is controlled by a common second signal.

3. The semiconductor device according to claim 1, further comprising a third circuit, wherein the third circuit is configured to apply a first potential to the first output node.

4. The semiconductor device according to claim 2, further comprising a third transistor and a fourth circuit,
   wherein a third signal is configured to control an on or off state of the third transistor,
   wherein the third transistor is configured to control conduction between the first output node and a wiring, wherein a first potential is supplied to the wiring, wherein the fourth circuit is configured to generate the second signal and the k first signals.

5. The semiconductor device according to claim 1, wherein the second transistor includes an oxide semiconductor layer where a channel is formed.

6. An electronic component comprising the semiconductor device according to claim 1.

7. An electronic device comprising:
the semiconductor device according to claim 1; and
a display device.

8. An electronic device comprising:
the electronic component according to claim 6; and
a display device.

9. A semiconductor device comprising:
a first output node, and
a first circuit,
wherein the first circuit includes a first transistor, a second transistor, a capacitor, and a first memory circuit including a second output node,
wherein a first signal is configured to be input to the first circuit,
wherein, in the first circuit:
one of terminals of the capacitor is electrically connected to the first output node,
the other of the terminals of the capacitor is electrically connected to a third output node,
the first transistor is configured to control conduction between the first output node and the second output node, and
the second transistor is configured to control supply of the first signal to a gate of the first transistor.

10. The semiconductor device according to claim 9, wherein in the first circuit, an on or off state of the second transistor is controlled by a common second signal.

11. The semiconductor device according to claim 9, further comprising a third circuit, wherein the third circuit is configured to apply a first potential to the first output node.

12. The semiconductor device according to claim 10, further comprising a third transistor and a fourth circuit,
wherein a third signal is configured to control an on or off state of the third transistor,
wherein the third transistor is configured to control conduction between the first output node and a wiring,
wherein a first potential is supplied to the wiring,
wherein the fourth circuit is configured to generate the second signal and the first signal.

13. The semiconductor device according to claim 9, wherein the second transistor includes an oxide semiconductor layer where a channel is formed.

14. A semiconductor device comprising:
a first output node, and
k first circuits, where k is an integer of two or more,
wherein each of the k first circuits includes a first transistor, a second transistor, a capacitor, and a first memory circuit including a second output node,
wherein k first signals are configured to be input to the different k first circuits, respectively,
wherein, in each of the k first circuits:
one of terminals of the capacitor is electrically connected to the first output node,
the other of the terminals of the capacitor is electrically connected to a third output node,
the first transistor is configured to control conduction between the first output node and the second output node,
the second transistor is configured to control supply of one of the k first signals to a gate of the first transistor, and
the other of terminals of the capacitor is electrically connected to the gate of the first transistor.

15. The semiconductor device according to claim 14, wherein in the k first circuits, an on or off state of the second transistor is controlled by a common second signal.

16. The semiconductor device according to claim 14, further comprising a third circuit, wherein the third circuit is configured to apply a first potential to the first output node.

17. The semiconductor device according to claim 15, further comprising a third transistor and a fourth circuit,
wherein a third signal is configured to control an on or off state of the third transistor,
wherein the third transistor is configured to control conduction between the first output node and a wiring,
wherein a first potential is supplied to the wiring,
wherein the fourth circuit is configured to generate the second signal and the k first signals.

18. The semiconductor device according to claim 14, wherein the second transistor includes an oxide semiconductor layer where a channel is formed.

* * * * *